United States Patent [19]

Kroger

[11] Patent Number: 4,544,937
[45] Date of Patent: Oct. 1, 1985

[54] FORMATION OF NORMAL RESISTORS BY DEGENERATE DOPING OF SUBSTRATES

[75] Inventor: Harry Kroger, Sudbury, Mass.
[73] Assignee: Sperry Corporation, New York, N.Y.
[21] Appl. No.: 481,514
[22] Filed: Apr. 1, 1983
[51] Int. Cl.[4] .......................................... H01L 39/22
[52] U.S. Cl. ................................ 357/5; 357/4; 357/12; 357/57
[58] Field of Search ........................ 357/5, 4, 57, 12

[56] References Cited

U.S. PATENT DOCUMENTS

| 4,220,959 | 9/1980 | Kroger | 357/5 |
| 4,224,630 | 9/1980 | Kroger | 357/5 |
| 4,421,785 | 12/1983 | Kroger | 357/5 |
| 4,423,430 | 12/1983 | Masuo | 357/5 |
| 4,430,662 | 2/1984 | Jillie, Jr. | 357/5 |
| 4,470,190 | 9/1984 | Fulton | 357/5 |
| 4,486,464 | 12/1984 | Young | 357/5 |
| 4,490,733 | 12/1984 | Kroger | 357/5 |

Primary Examiner—Martin H. Edlow
Attorney, Agent, or Firm—Howard P. Terry; Arnold L. Albin

[57] ABSTRACT

In superconductive integrated circuit a semiconductor substrate is used in combination with normal resistors formed by degenerate doping of the substrate in selected regions. Doping is preferably performed by planar diffusion or ion implantation. Application of the invention to fabrication of a Josephson Atto-Weber gate by forming a normal resistor intermediate the junctions is also disclosed.

17 Claims, 7 Drawing Figures

ND RESISTORS BY
FORMATION OF NORMAL RESISTORS BY DEGENERATE DOPING OF SUBSTRATES

BACKGROUND OF THE INVENTION

1. Field of the Invention

The invention relates to superconductive circuits, and in particular, to semiconductive substrates rendered highly conductive by degenerate doping.

2. Description of the Prior Art

Superconductive memory and logic circuits are known in the art which utilize tunnel junctions for the active switching elements or gates including Josephson devices and QUITERON. It is important for reliable and reproducible fabrication of superconductive integrated circuits to maintain precise control of the values of normal resistors used in the circuits. Normal resistors are herein defined as resistive elements which maintain substantially constant resistance values whether the gate is in the zero-resistance or non-zero resistance state when operated at superconducting temperatures. Such normal resistors have heretofore been fabricated by depositing a thin metallized resistive film on an insulating substrate. These films are then etched and patterned to form the desired resistive network. Methods for rendering organic polymers conductive by ion implantation have also been discussed. While high conductivities are achieved, such polymers are unsuitable for use at superconductive temperatures. Implantation of ions to modify the conductivity of inorganic insulators, such as glasses and metal oxides, has also been taught. Ion implantation techniques have also been utilized to form resistive structures on a semiconductor wafer by bombarding the wafer surface with high energy ions. However, these techniques have not heretofore been extended to superconductive integrated circuits. A method for forming a normal resistor by altering a tunnel junction itself has been described by Lawrence N. Smith in Ser. No. 468,603, *Superconductive Tunnelling Junction Resistor and Method of Fabrication*, filed Feb. 22, 1983, assigned to the assignee of the present invention. That invention comprises a superconductive junction of superposed layers of superconductive material with a barrier layer therebetween, wherein at least one of the superconductive layers has been treated so as to remain in the normal state when the junction is operated at superconducting temperatures, whereby providing a non-zero resistance. However, this approach does not provide for free selection of the resistance value. Another approach has been described by H. Kroger in Ser. No. 468,604, *Fabrication of Superconductive Tunneling Junction Resistors and Short Circuits by Ion Implantation*, filed Feb. 22, 1983, and also assigned to the assignee of the present invention. This method permits transforming a Josephson junction into a normal resistor or even a short circuit. However, it requires active disruption of the barrier or "poisoning" of the superconductive electrodes. While it offers great flexibility in providing a wide range of resistance values, the fact that the barrier may be disrupted during the processing requires close control to avoid disrupting other Josephson junctions in proximity.

The present invention overcomes these disadvantages of the prior art by using a semiconductor substrate to form resistive elements. Such a resistor may be formed by the bulk resistivity of a diffused region in a semiconductive substrate. This is accomplished by introducing a dopant into the substrate by a diffusion process. Silicon wafers, for example, are commonly used as the substrates for Josephson logic fabrication. In the semiconductor art, silicon and germanium deposition technology has been developed to a high degree over the past 10–15 years so that in this area results having commercial uniformity are routinely achieved. Of all the semiconductors, silicon and germanium have been extensively studied and the properties and behavior are thoroughly understood. Further, polished single-crystal silicon wafers are readily available at relatively low cost as a result of their widespread use in the semiconductor industry, and silicon has a beneficially high thermal conductivity at 4° K., a desirable feature for the operation of a computer using Josephson integrated circuits. But before the present invention, this silicon served no electronic function, merely affording a passive convenient mechanical substrate with good thermal properties. It is known that these semiconductor materials can be precisely and readily doped to provide either n or p type material with a precisely controlled Fermi level from intrinsic to degenerate. This invention makes use of the electronic conduction possible in degenerately doped silicon at 4° K. to incorporate normal resistive elements as an integral part of the superconductive circuits.

SUMMARY OF THE INVENTION

It has been discovered that normal resistors for superconductive integrated circuits can be formed by doping semiconductive substrates with degenerate concentrations of an impurity. The technique permits the controlled addition of impurites resulting in resistive elements which act as normal resistances at superconducting temperatures in combination with tunneling junctions to form monolithic integrated circuits. A wide variety of semiconductors, such as germanium, silicon, and gallium arsenide may be rendered conductive by this invention by diffusing the impurities into the surface at high temperature.

Normal resistors can also be formed in a semiconductive substrate by ion implantation of high concentrations of impurities. Although a somewhat slower process, an advantage is that ion implantation can be used to introduce species which cannot be added by chemical means. Both metallic and nonmetallic ions may be employed to render the semiconductor conductive. The above methods of treating a semiconductor wafer to form a normal resistance at superconducting temperatures comprised doping a predetermined area of semiconductor substrate with a suitable impurity having a concentration sufficient to render the desired region degenerate. The degenerate region is then contacted by electrodes associated with the tunneling junction and control circuits. Application of the invention to fabrication of a Josephson Atto-Weber gate by forming a normal resistor in the substrate intermediate the junctions is also disclosed.

DESCRIPTION OF THE PREFERRED EMBODIMENT

Figure 1:
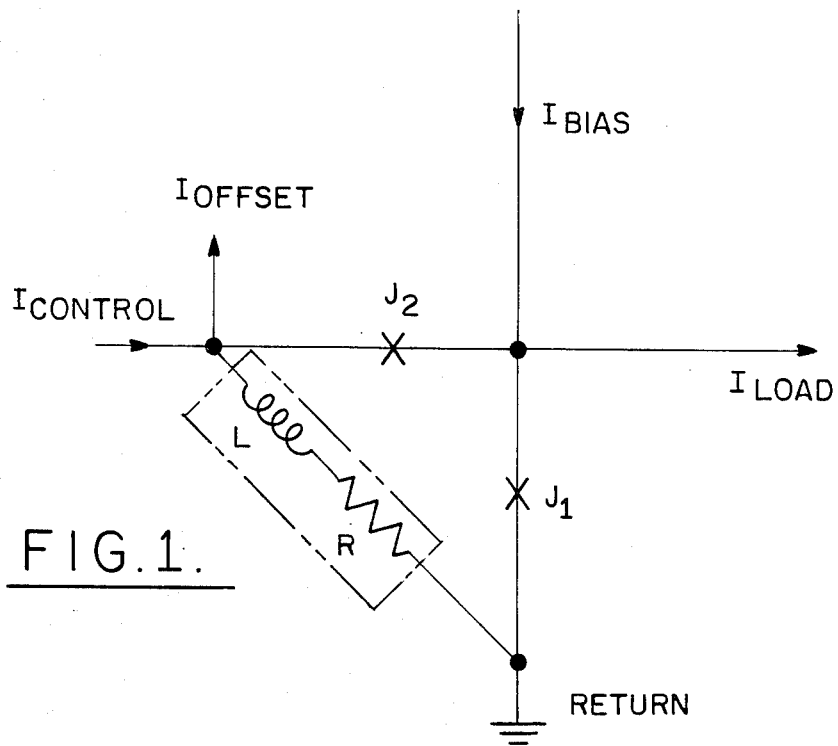
FIG. 1 is a circuit diagram for a Josephson Atto-Weber switch.
Figure 2:
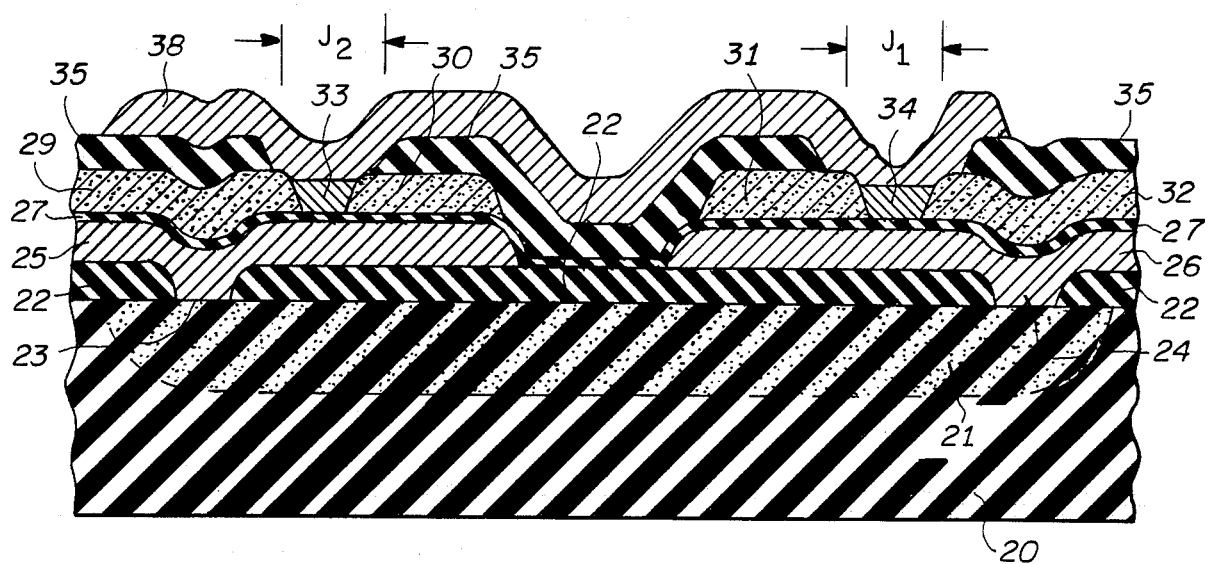
FIG. 2 is a cross section showing the physical implementation of a Josephson Atto-Weber circuit with a degenerately-doped resistive substrate.

A preferred embodiment in which a degenerately doped semiconductor may be utilized as a resistor is illustrated in FIGS. 1 and 2, which show a Josephson Atto-Weber (JAWS) circuit fabricated in accordance with the SNAP procedure of D. W. Jillie and L. N. Smith in Ser. No. 252,528, Superconductive Tunnel Junction Integrated Circuit and Method of Manufacture Thereof, filed Apr. 9, 1981, and assigned to the assignee of the present invention. This embodiment is merely exemplary and used to illustrate a basic concept which could also be implemented with other Josephson circuit technologies and other superconductive logic devices. In FIG. 1, a schematic diagram of the JAWS circuit is shown. $J_1$ and $J_2$ represent Josephson tunneling junctions. R represents the normal resistance of a degenerately doped substrate and L the parasitic inductance associated therewith. A control current $I_{control}$ and an offset current $I_{offset}$ are coupled to the doped substrate L, R and one electrode is Josephson junction $J_2$. Note that while L and R are shown as discrete components for circuit purposes, in practice they will be distributed through the doped region of substrate. Thus the positions of R and L in the schematic could be interchanged without modifying the circuit operation. The common electrodes of Josephson junctions $J_1$ and $J_2$ are coupled to a bias current $I_{bias}$ and load current $I_{load}$. The load currents, control current, and bias currents are returned to a common ground plane. The common connection of the degenerate resistor substrate R, L and Josephson junction $J_1$ is also coupled to the ground return.

FIG. 2 shows in cross section the structure of a JAWS gate constructed using the SNAP technology as applied to the present invention. A substrate 20, preferably a silicon wafer, has a region 21 doped with donor or acceptor impurities. A p-type wafer is obtained by doping with p-type impurities and an n-type wafer by doping with n-type impurities. An insulator 22 which may be comprised of silicon dioxide formed by thermal oxidation of the silicon substrate defines a plurality of vias 23 and 24 for affording contact to the normal resistance portion 21 of the substrate. The device may also be fabricated without insulator 22, relying on the insulating properties of the non-degenerate regions of the silicon wafter at 4° K. While the added insulation is useful in device testing at room temperature (300° K.), and it is usually a byproduct of the thermal diffusion process, it may advantageously be eliminated or removed to provide improved thermal contact of the active elements to the substrate. An electrode 25 preferably of niobium deposited in a thickness of approximately 3,000 Å provides contact as the lower electrode of Josephson junction $J_2$ and is also coupled to normal resistance 21 and the control and offset power supplies (not shown). A similar electrode 26, also of niobium, is desposited at an adjacent via 24 in insulator 22 to make contact with degenerately doped region 21, and also forms the return connection to junction $J_1$. Electrode 26 is also coupled to the bias current and the output load returns (not shown). Superposed on electrodes 25 and 26 and insulator 22 is a barrier layer 27 which will subsequently form the Josephson tunneling barriers for $J_2$ and $J_1$ at 33 and 34, respectively. The barrier may be comprised of a semiconductor material such as silicon, germanium or alloys thereof. If the barrier is comprised of silicon, it may be partially anodized during the subsequent processing. Upper electrodes of niobium, preferably of the order of 600 Å in thickness, are then deposited over the barrier at 29-34. In subsequent processing, as noted heretofore in the SNAP process of said Ser. No. 252,528, the upper electrodes are anodized except in regions defining the Josephson junctions $J_1$ and $J_2$ and this anodization may extend partially through the silicon barrier. The anodized regions are noted as 29-32 and the nonanodized contact electrodes by regions 33 and 34. A further layer of silicon dioxide insulation 35 is thereupon deposited over the upper niobium contacts. Insulating layer 35 provides the necessary isolation except at the junction contact regions 33 and 34. Bias supply and load currents are coupled to the uppermost niobium contact layer 38, which also provides the common contact to the aforesaid junctions 33 and 34.

As noted above by varying the layout of the circuit on the substrate, the JAWS device may also be implemented successfully without the use of insulating layer 22 if the area of the substrate underlying the junctions is nondegenerately doped, since at the superconducting temperatures at which the Josephson circuit would operate, the nondegenerately doped silicon would then be insulating.

Figure 3:
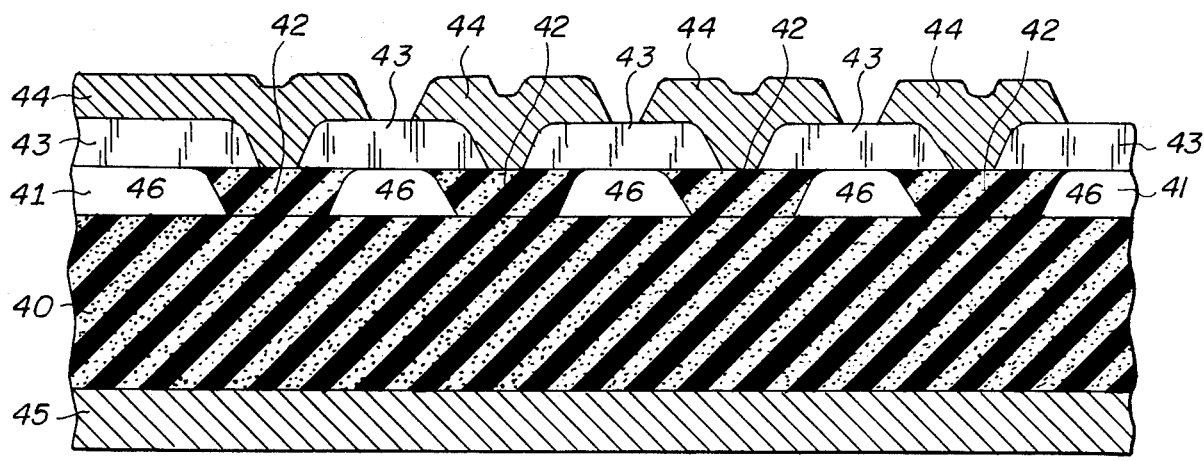
FIG. 3 is a cross section showing a general concept for contacting a multiplicity of logic gates by means of a degenerately-doped conductive substrate.

Another embodiment of the present invention which may be used with a multiplicity of logic gates is shown in FIG. 3, which again represents the cross section of a device employing a degenerately doped substrate as a resistive path. A degenerately doped substrate 40 which may be a semiconductor such as silicon is provided with a nondegenerately doped epitaxial layer 41 in which are located a plurality of degenerately doped areas 42. A further plurality of gate elements 43, which are shown herein schematically and not in detail and which may be comprised, for example, of trilayer Josephson junctions, are formed in the usual manner on the epitaxial layer 41. Contact layers 44 which may be of niobium or other materials suitable for use at superconducting temperatures are overlaid on the gates 43 to provide electrical contact as desired between associated gates and, by virtue of the controlled resistance path through the degenerately doped epitaxial layer and substrate, to a power supply bus 45 underlaying the substrate. The power supply bus may be patterned if desired to aportion the power between the gates 43. Note that the epitaxial layer has insulating properties at 4° K. in nondegenerately doped regions 46 which serve to insulate the gates 43 from the substrate except in the desired contact regions. The power supply bus 45 is preferably comprised of a superconductive metal such as niobium. The degenerately doped substrate 40 may also be used to define regions of normal resistance and interconnected in a similar manner to that shown above for providing bias currents to the respective gates.

Figure 4:
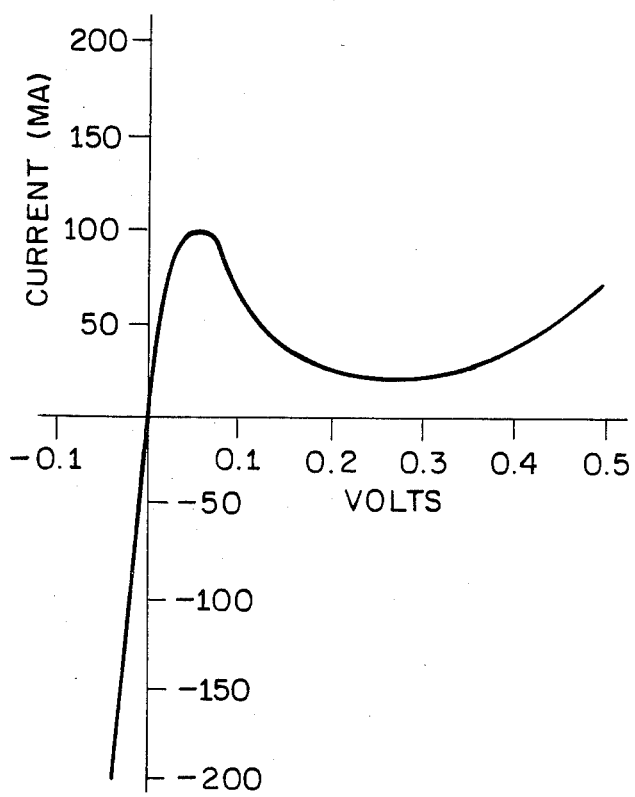
FIG. 4 shows an I-V characteristic curve for an Esaki tunnel diode.

Additional flexibility in the attainment of desired resistance in a substrate may be obtained by the use of multiply diffused or implanted degenerately doped regions such as p-n junctions rather than the singly doped p and n regions. A degenerately doped junction of this type would include, for example, a conventional tunnel junction, such as an Esaki diode. Referring to FIG. 4, which is a typical curve of the current-voltage (I-V) characteristic of an Esaki diode, it may be seen that where the operating voltage is of the order of millivolts, as in Josephson circuits, the characteristic I-V curve is essentially linear; therefore the tunnel diode will present a linear resistance. Note that the tunnel diode is made with high impurity concentration levels resulting in degeneracy on both sides of the p-n junction. Note also from FIG. 4 that the slope of the I-V curve below about 15 millivolts indicates an effective forward resistance of approximately 0.2 ohms. At higher forward bias the diode enters into a negative resistance characteristic, hence would not be useful in a resistive application requiring operating voltages of the order of 50 millivolts or greater. While the curve of FIG. 4 is characteristic of a tunnel diode at room temperature of approximately 300° K., at superconductive temperatures of the order of 4° K. the linear region is more restricted. Typically, for a silicon tunnel diode at 4° K., the useful linear voltage range is of the order of 20 millivolts, and the diode resistance in the linear range is less than 1 ohm.

Figure 5:
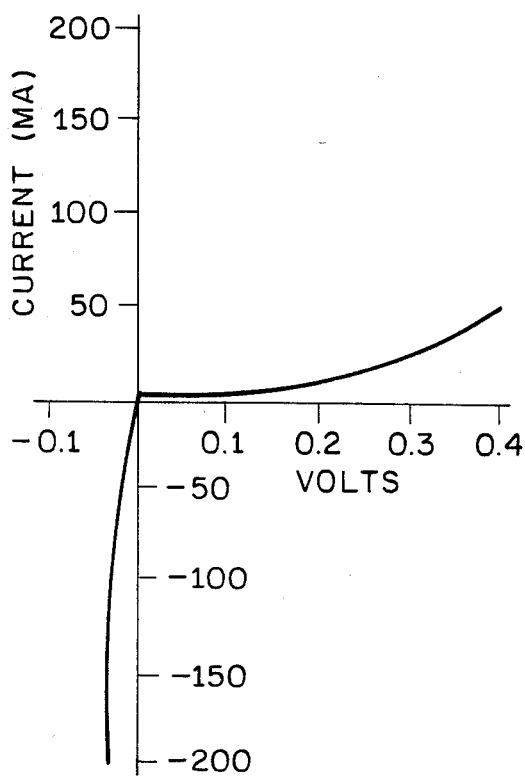
FIG. 5 shows an I-V characteristic curve for a "backwards" diode.

If the doping concentrations on the p and n side of the p-n junction are nearly degenerate, the diode will have an I-V characteristic as shown in FIG. 5 which, for small voltages provides a greater current in the reverse direction than for the current in the forward direction. This device is known as "backward diode". Since the reverse current increases approximately exponentially with the voltage, this characteristic cannot be used where a linear resistor is required. However, the forward characteristic provides a relatively large-valued linear resistance.

Another embodiment comprises the fabrication of degenerately doped $n^+$-i-$n^+$ or $p^+$-i-$p^+$ diodes with a thin enough intrinsic layer i to permit some conduction at about 4° K. If the layer i is of the order of several microns in thickness, some conduction may occur by the ordinary drift and diffusion of electrons and holes.

It is clear that the conductive properties of a semiconductor at superconductive temperatures can be markedly changed by doping with minute quantities of impurities. High concentrations of impurities are required so that conduction at 4° K. is possible. The level of doping may be varied to achieve desired resistivity characteristics, provided that degeneracy is maintained. Since the resistivity of the material is determined by the concentration of the majority carriers, it can be modified by appropriate choice of a dopant and its concentration. Typical values of resistivity at 300° K. are 10 to $10^{+4}$ ohm-cm for a semiconductor, $10^{-6}$ to $10^{-5}$ ohm-cm for a conductor, and $10^{12}$ to $10^{16}$ ohm-cm for an insulator. Degeneracy can be achieved in silicon by doping to a concentration of $10^{19}$/cm$^3$ to $10^{20}$/cm$^3$.

Preferably, arsenic or phosphorus is used as an impurity for making degenerate n-type silicon, while boron may be used for highly doped p-type silicon, due to their relatively favorable solid solubility in silicon. Other dopants include antimony for n-type devices and aluminum, gallium, and indium for p-type devices.

Figure 6:
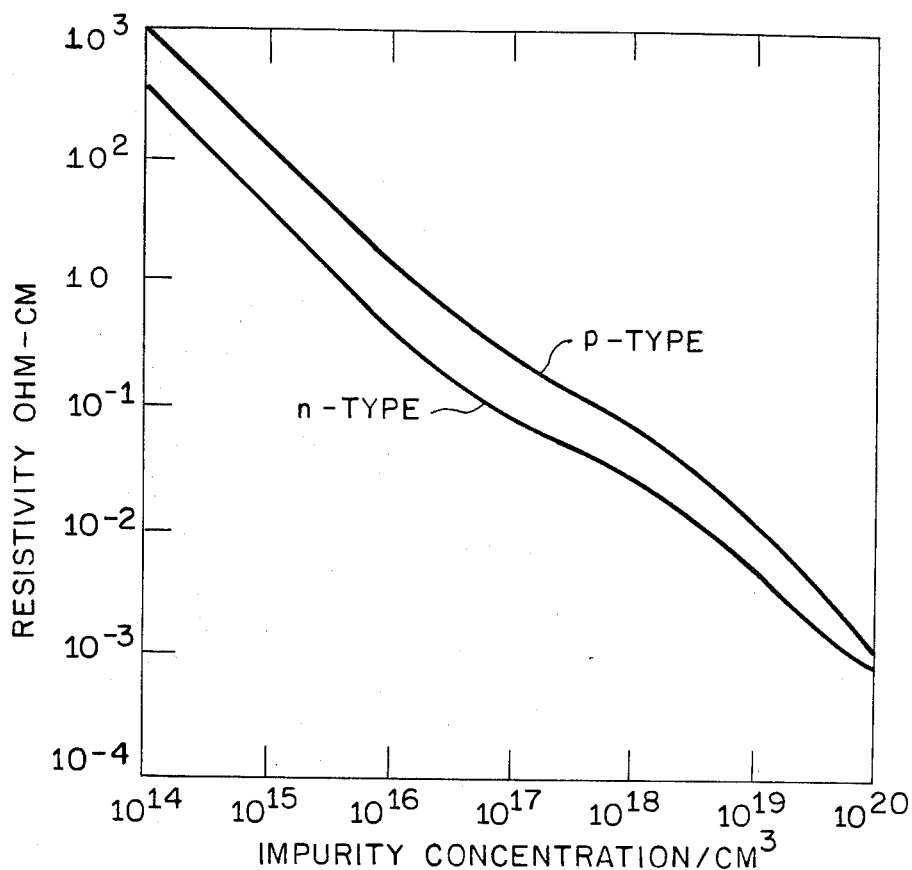
FIG. 6 shows curves for resistivity as a function of impurity concentration at room temperature for n-type and p-type impurities in a silicon substrate.
Figure 7:
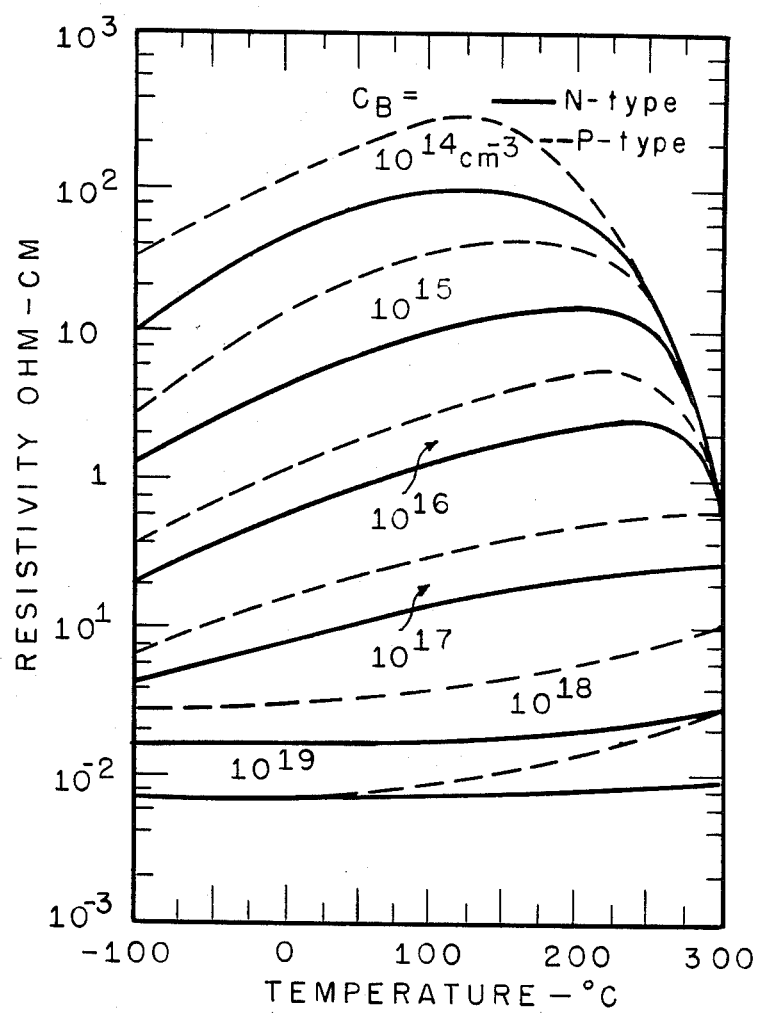
FIG. 7 shows curves for resistivity as a function of impurity concentration in a silicon substrate for n-type and p-type impurities over a range of temperatures.

FIG. 6 shows curves representing the resistivity of silicon as a function of acceptor or donor concentration. This curve is adapted from J. C. Irvin, Resistivity of Bulk Silicon and of Diffused Layers in Silicon, *Bell System Tech. J.*, vol. 41, p. 387, 1962, and represents a compilation of data for heavily doped silicon at room temperature (300° K.). While clearly showing the tendency of resistivity to decrease with increasing concentrations of impurities, the data cannot be extrapolated to higher concentrations nor to temperatures near absolute zero without error. Further, the original data showed greatest uncertainty in the degenerate region. FIG. 7 is a curve, also fo silicon, showing resistivity as a function of impurity concentration over a temperature range of $-100°$ C. to $+300°$ C., adapted from H. F. Wolf, Silicon Semiconductor Data, Pergamon Press. p. 51, 1963.

It will be clear to those skilled in the art that the principles enumerated above are also applicable to an insulating substrate having deposited thereon a polycrystalline semiconductor or an epitaxially grown semiconductor. Suitable insulating substrates include sapphire and quartz. Selected regions of the semiconductor material would then be degenerately doped as previously described. The resistive properties of the degenerately doped material will remain substantially unchanged throughout the remainder of the processing in the formation of the integrated circuit, as is also obtained for single-crystal substrates.

Suitable methods of production of the degenerately doped regions include standard planar diffusion techniques and ion implantation followed by annealing. Such procedures are well known in a semiconductor art. In the diffusion process, which is presently the most widely used method of introducing controlled amounts of impurities into a silicon substrate, the impurity concentrations are controlled by either limiting the total amount of impurities introduced into the semiconductor during the diffusion step, as in limited-source (Gaussian) diffusion, where the surface concentration of impurities is inversely proportional to the square root of the diffusion time, or by the constant-source diffusion process, in which the impurity concentration at the semiconductor surface is maintained at a constant level throughout the diffusion cycle determined by the temperature and carrier-gas flow rate of the diffusion furnace. Here the surface concentration is frequently determined by the solid-solubility concentration limit of the particular dopant in the semiconductor. Note that in this process the total amount of impurities diffused into silicon increases indefinitely with time. If the diffused impurity type is different from the resistivity type of the substrate material, a junction will be formed at the points of infusion. The regions of diffusion may be defined by exposure through a mask. Characterisitically impurities introduced in an earlier diffusion step continue to diffuse during subsequent diffusion cycles, since such diffusion may require temperatures as high as 950° C. For the Josephson devices contemplated by the SNAP process, subsequent steps are commonly performed at a maximum of 150° C., so that these later steps will not change the value of sheet resistance which has been originally established.

An alternative method of introducing impurities into a semiconductor is that of ion implantation. A semiconductor may be implanted through an overlaying mask or by scanning the ion beam in a predetermined pattern. Here, as contrasted with the diffusion process, the numbers of implanted ions are controlled by the external system parameters, such as the ion source and accelerating energy. The depth of penetration is a function of the kinetic energy of the impurity ions, crystalline structure, and the mass of the recipient atoms. Beneficially, the implantation may be carried out at temperatures at which diffusion is insignificant. Following implantation, the substrate is preferably annealed at a temperature of the order of 750° C. Again the temperature at which the implantation anneal is performed is sufficiently high as compared to the subsequent processing steps that the sheet resistance will remain as originally established. Note also that the ion implantation can be used in combination with previously diffused device structures without effecting these prior structures.

There are substantial advantages to the use of the substrate to provide normal resistors over the deposited film processes of the prior art. For example, since the normal resistors are formed within the substrate itself, which is usually a "waste" area, used only for physical support of the integrated circuit, there is a resulting conservation of area above the substrate. It also provides convenient circuit tie points or crossovers with less area consumption. Obviously, the smaller area consumption per gate or crossover will permit a greater number of functional devices per given chip area. Further, advantage may be taken of the highly developed technology and fabrication of silicon semiconductor devices to produce highly reproducible sheet resistances. Moreover, the values of the sheet resistance may be readjusted, if not within the desired tolerances, before subsequent processing steps. For example, sheet resistance of a boron-diffused region may be increased by driving the diffusion deeper with additional heat processing, or decreased by adding a second implantation and reannealing. By slightly modifying the implantation dosage or anneal conditions, the desired modification sheet resistance may readily be obtained.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A tunnel junction device for use as a gate in superconductive circuits, comprising;
   a semiconductive substrate,
   a degeneratively doped region within said substrate, said degenerately doped region defining a normal resistance at superconducting temperatures,
   first and second regions comprising a first layer of superconductive material spaced apart and superposed over at least portions of said normal resistance and in contact therewith,
   a barrier layer deposited on said first layer of superconductive material,
   a second layer of superconductive material superposed with respect to said barrier layer, and having at least one opening therethrough defining a tunneling junction area,
   an insulating layer deposited on said second layer of superconductive material, having an opening defining said tunneling junction area, and
   a third layer of superconductive material, superposed with respect to said insulating layer and said junction area of said barrier for electrical contact to said barrier layer.

2. A tunnel junction device as set forth in claim 1, further comprising an insulating layer superposed between said first layer of superconductive material and said substrate, with an opening defining said at least one contact area between said first layer of superconductive material and said substrate.

3. A superconductive logic circuit, comprising a plurality of logic gates as set forth in claim 1, at least two of said gates including said first layer of superconductive material in contact with said degenerately doped region,
   said third layer of superconductive material further comprised of means for contacting a plurality of junction areas of said barrier layer, and
   current means for inducing switching of said junctions from a zero voltage state to a non-zero voltage state.

4. A current switched Josephson gate comprised of a semiconductive substrate, at least two Josephson tunnel junctions on said substrate, a normal resistance intermediate said junctions formed by degenerate doping of a predetermined region of said semiconductive substrate, said junctions having respective contact electrodes deposited on said region, and means for coupling a control current, offset current, bias current and a load to said junctions, so that said control current causes switching of said gate from the zero voltage state to a non-zero voltage state.

5. A superconductive logic circuit, comprising:
   a degenerately doped semiconductor substrate,
   an epitaxial semiconductor layer superposed thereon,
   a plurality of degenerately doped regions and nondegenerately regions disposed in said epitaxial layer,
   a plurality of superconductive logic gates deposited on said epitaxial layer, each of said gates having a junction area superposed on a non-degenerately doped region of said layer,
   at least two of said gates having a contact area superposed on and adjoining one of said degenerately doped regions;
   at least one layer of superconductive material superposed on said at least two of said gates and said one degenerately doped region.

6. A logic circuit as set forth in claim 5, further comprising a layer of superconductive material underlying said degenerately doped substrate.

7. The logic circuit of claims 6 further comprising a supply of bias current, in which said underlying layer is patterned to apportion said supply of bias current to said gates.

8. A tunnel junction device as set forth in claim 1 wherein said region is doped by an impurity to a concentration of at least $10^{19}.cm^3$.

9. A tunnel junction device as set forth in claim 1, wherein said substrate is selected from the compounds consisting of the Group III and V elements of the periodic table.

10. A tunnel junction device as set forth in claim 8, wherein said impurity is a donor impurity selected from the group consisting of the Group V elements of the periodic table.

11. A tunnel junction device as set forth in claim 10, wherein said donar impurity is selected from the group consisting of phosphorus, arsenic, and antimity.

12. A tunnel junction device as set forth in claim 8, wherein said impurity is an acceptor impurity selected from the group consisting of the Group III elements of the periodic table.

13. A tunnel junction device as set forth in claim 12, wherein said impurity is selected from the group consisting of aluminium, gallium, indium, and boron.

14. A tunnel junction device as set forth in claim 8, wherein said degeneratively doped region is further comprised of a plurality of regions diffused with said impurities.

15. A tunnel junction device as set forth in claim 14, wherein said region is further comprised of n+ and p+ doped regions in proximity.

16. A tunnel junction device as set forth in claim 14, wherein said region is further comprised of n+ regions separated by a layer of undoped substrate material of a predetermined thickness adapted to permit conductive activity.

17. A tunnel junction device as set forth in claim 14, wherein said region is further comprised of p+ regions separated by a region of undoped substrate material of a predetermined thickness adapted to provide conductive activity.

* * * * *